United States Patent [19]
Rangarajan et al.

[11] Patent Number: 6,034,771
[45] Date of Patent: Mar. 7, 2000

[54] SYSTEM FOR UNIFORMLY HEATING PHOTORESIST

[75] Inventors: Bharath Rangarajan, Santa Clara; Bhanwar Singh, Morgan Hill; Sanjay K. Yedur, Santa Clara; Michael K. Templeton, Atherton, all of Calif.

[73] Assignee: Advanced Micro Devices, Inc., Sunnyvale, Calif.

[21] Appl. No.: 09/185,981

[22] Filed: Nov. 4, 1998

[51] Int. Cl.[7] .................................................. G01B 9/02
[52] U.S. Cl. ............................................. 356/345; 356/346
[58] Field of Search .................................... 356/345, 346, 356/124, 124.5, 402, 432, 434

[56] References Cited

U.S. PATENT DOCUMENTS

| | | |
|---|---|---|
| 4,518,848 | 5/1985 | Weber . |
| 4,859,572 | 8/1989 | Farid et al. . |
| 5,167,078 | 12/1992 | Bolde et al. . |
| 5,716,763 | 2/1998 | Benoit et al. . |
| 5,825,043 | 10/1998 | Suwa ........................................ 356/399 |

Primary Examiner—Frank G. Font
Assistant Examiner—Roy M. Punnoose
Attorney, Agent, or Firm—Amin, Eschweiler & Turocy, LLP

[57] ABSTRACT

A system for regulating heating temperature of a material is provided. The material may be a photoresist, a top or bottom anti-reflective coating, a low K dielectric material, SOG or other spin-on material, for example. The system includes a plurality of optical fibers, each optical fiber directing radiation to respective portions of the material. Radiation reflected from the respective portions are collected by a measuring system which processes the collected radiation. The reflected radiation are indicative of the temperature of the respective portions of the material. The measuring system provides material temperature related data to a processor which determines the temperature of the respective portions of the material. The system also includes a plurality of heating devices; each heating device corresponds to a respective portion of the material and provides for the heating thereof. The processor selectively controls the heating devices so as to regulate temperature of the respective portions of the material.

41 Claims, 9 Drawing Sheets

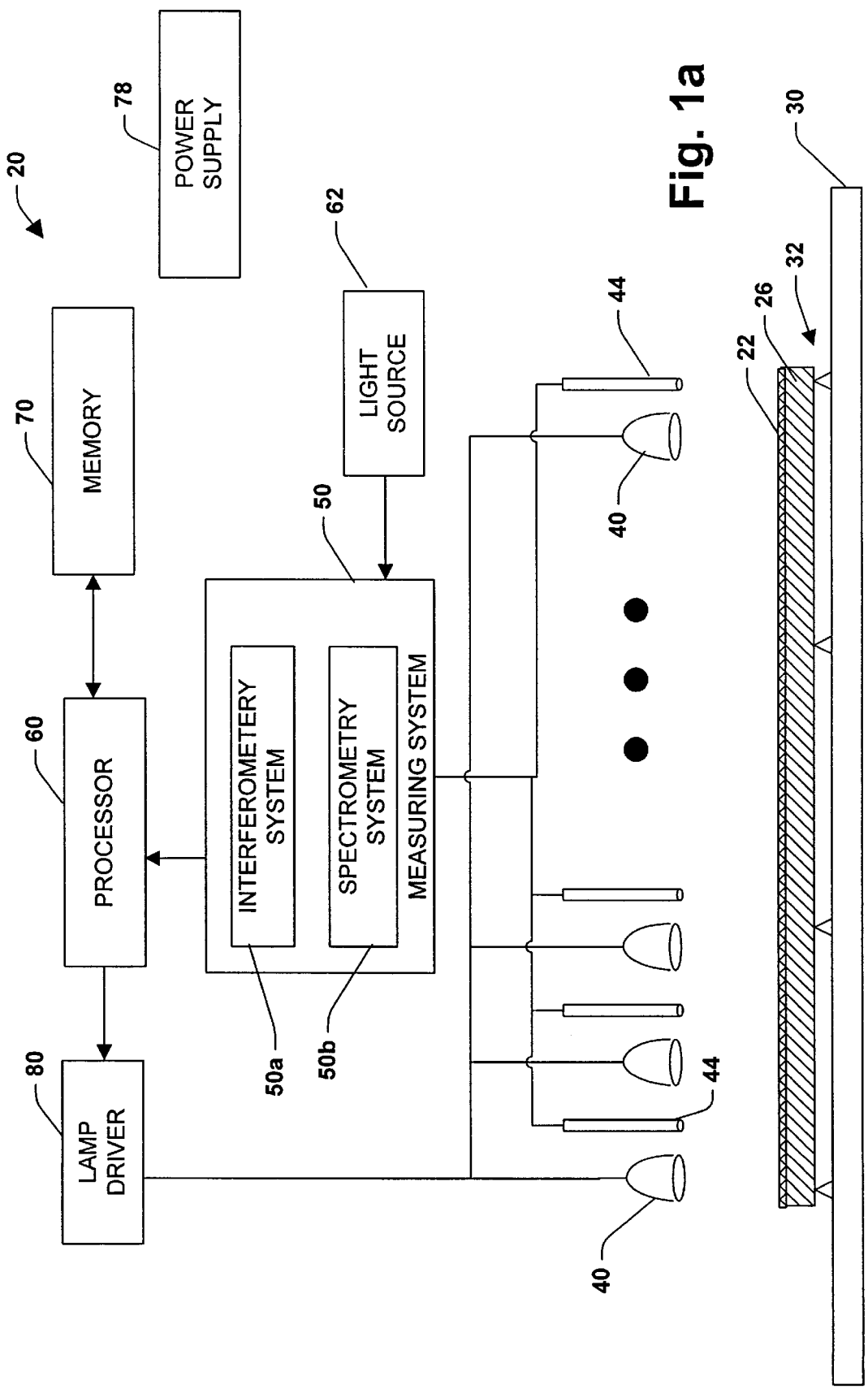

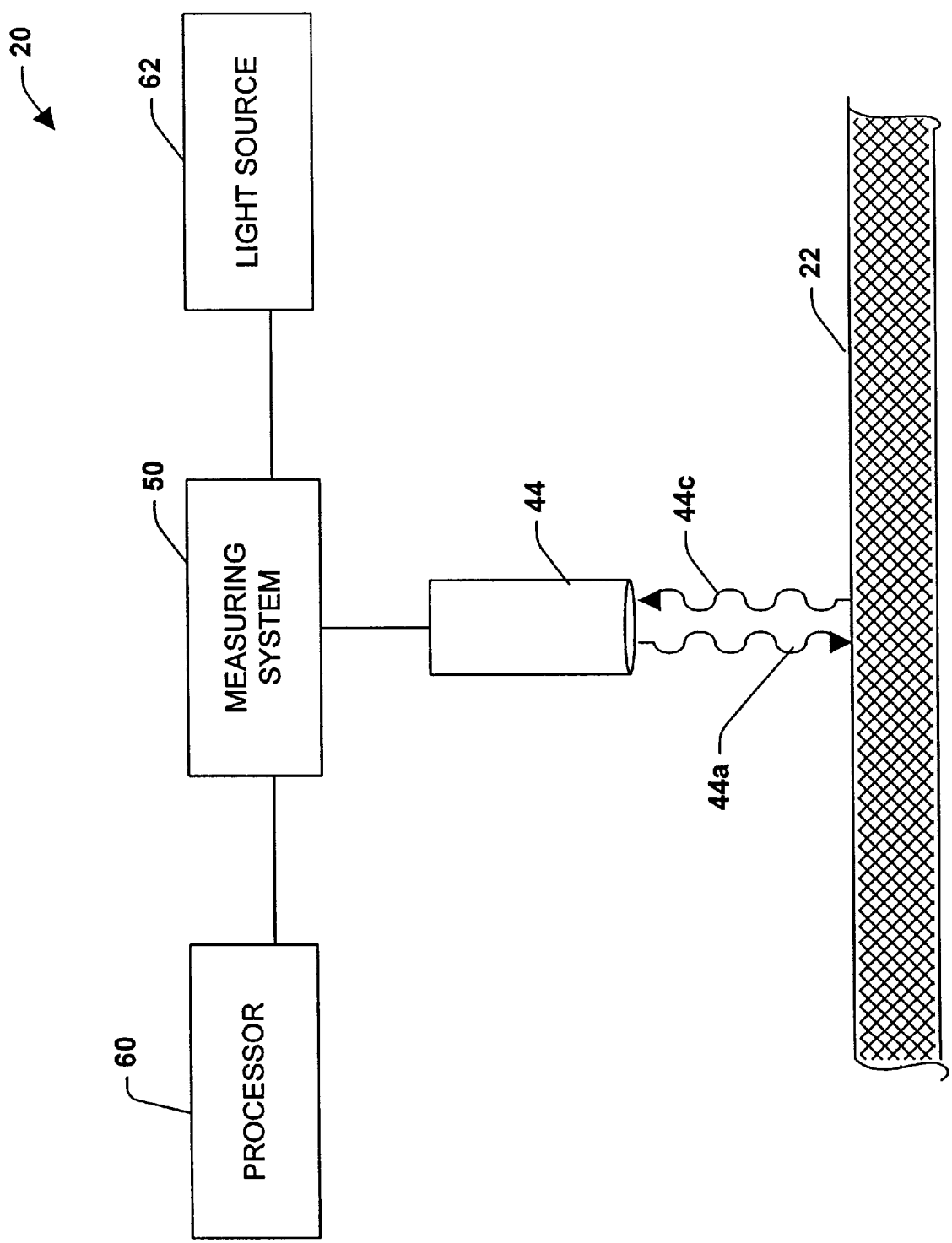

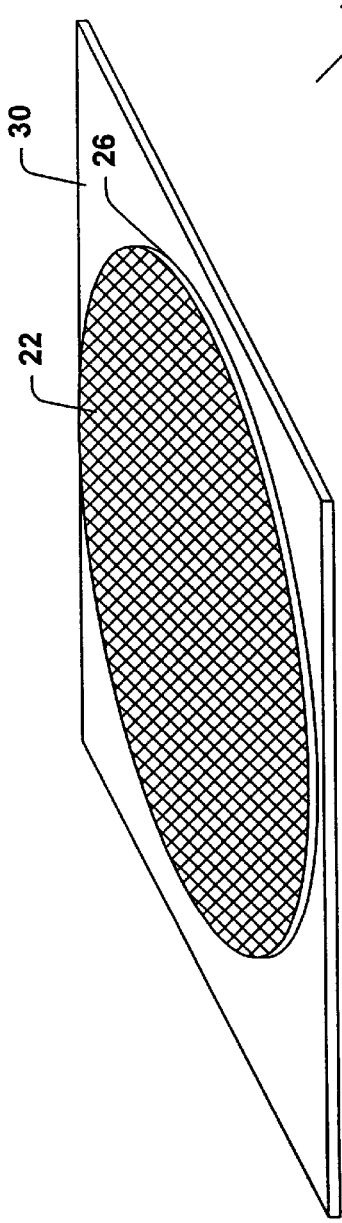
Fig. 2
Fig. 3
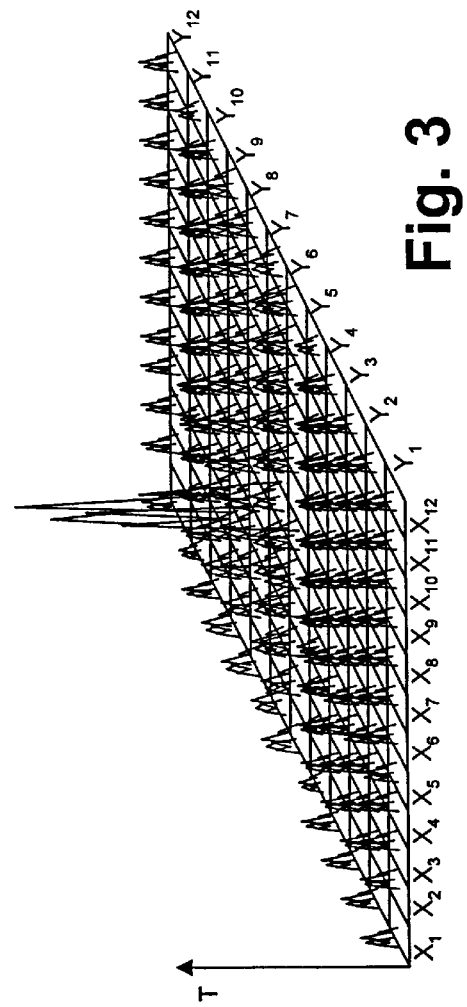
Fig. 4

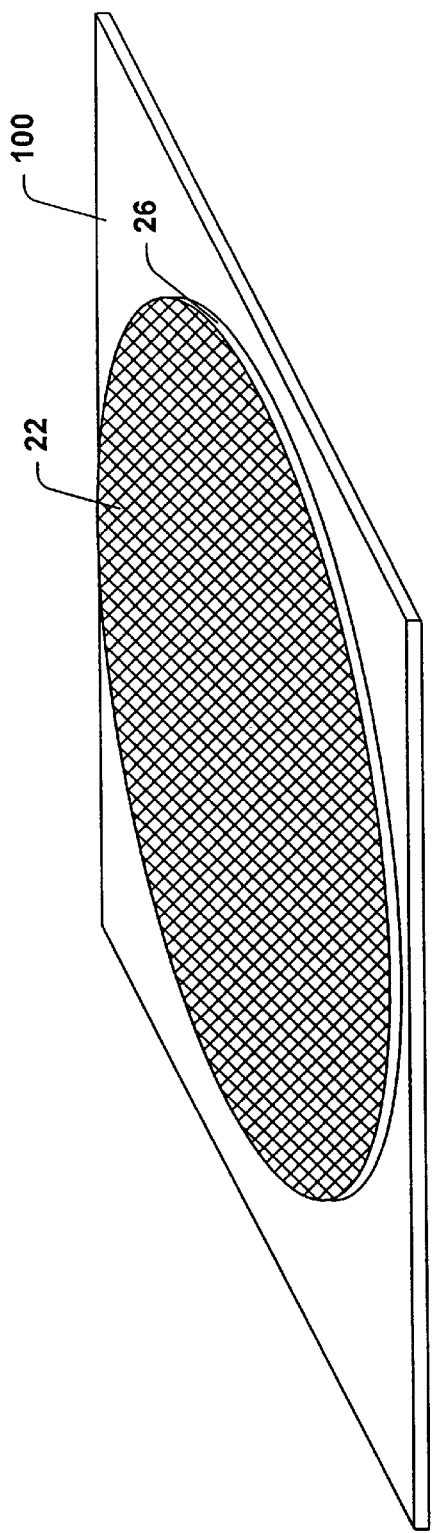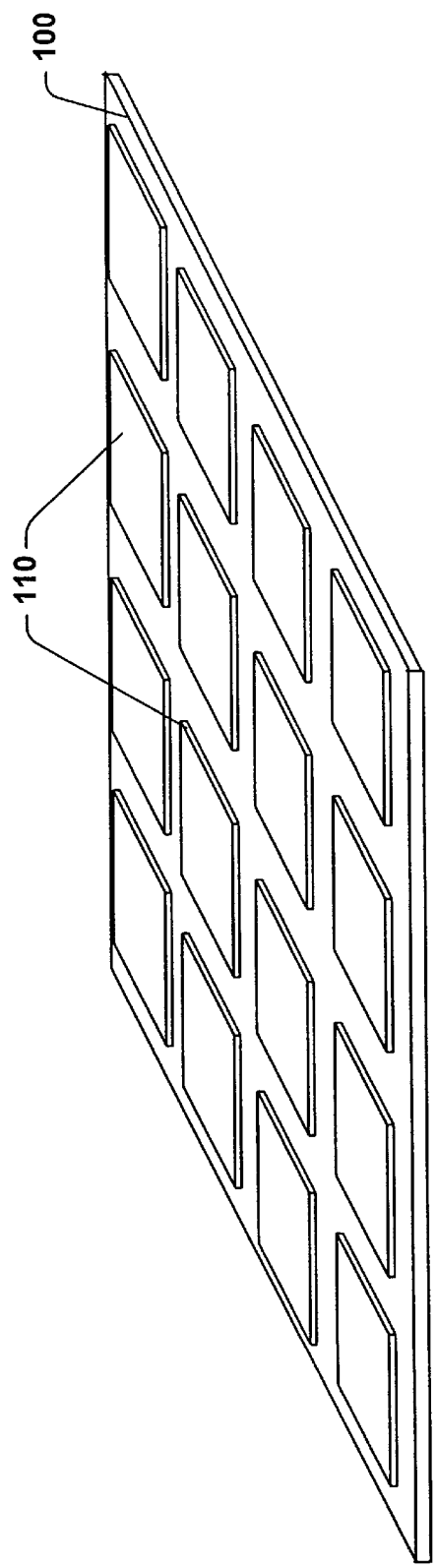

SYSTEM FOR UNIFORMLY HEATING PHOTORESIST

TECHNICAL FIELD

The present invention generally relates to semiconductor processing, and in particular to a system for uniformly heating a photoresist.

BACKGROUND OF THE INVENTION

In the semiconductor industry, there is a continuing trend toward higher device densities. To achieve these high densities there has been and continues to be efforts toward scaling down the device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist, application and heating of the photoresist are significant factors in achieving desired critical dimensions. The photoresist should be heated such that a uniform heating rate is maintained in order to insure uniformity and quality of the photoresist layer. The photoresist layer thickness typically is in the range of 0.1 to 3.0 microns. Good resist thickness control is highly desired, and typically variances in thickness should be less than ±10–20 Å across the wafer. Very slight variations in the photoresist thickness may greatly affect the end result after the photoresist is exposed by radiation and the exposed portions removed.

One of the variables in heating of photoresist film is the temperature at which heating occurs. In order to achieve uniform heating, a uniform temperature in a curing or enclosure chamber is necessary. Small changes in the time/temperature history of the photoresist can substantially alter image sizes, resulting in lack of image line control. A uniform time/temperature history of the photoresist is especially important with chemically amplified photoresists because image size control may be drastically affected by only a few degrees difference in temperature. Often substantial line size deviations occur when the temperature is not maintained within 0.5 degree tolerance across a silicon wafer. For example, when a photoresist is baked onto a substrate (e.g., wafer), temperature tolerances of ±0.2° C. are required.

An efficient system/method to uniformly heat a layer of temperature-sensitive film formed on a semiconductor substrate is therefore desired to increase fidelity in image transfer.

SUMMARY OF THE INVENTION

The present invention provides for a system which facilitates controlling photoresist baking temperature so as to facilitate uniform heating of a photoresist formed on a semiconductor substrate (e.g., wafer). A preferred embodiment of the system employs a plurality of optical fibers arranged to project radiation on respective portions of the photoresist. The radiation reflected from the photoresist is indicative of at least one of several parameters of the photoresist (e.g., thickness, color and absorption) which vary in correlation with photoresist temperature. A plurality of heaters are arranged to each correspond to a particular portion, respectively—each heater is responsible for heating the particular photoresist portion. The photoresist temperature is monitored by the system, and the heaters are selectively driven by the system so as to maintain photoresist temperature at a desired level. As a result, substantial uniformity in heating of the photoresist is achieved, which in turn increases fidelity of image transfer.

One particular aspect of the invention relates to a system for regulating photoresist heating temperature. At least one lamp operates to heat a portion of a photoresist, and a lamp driving system drives the at least one lamp. At least one optical fiber directs radiation to the portion of the photoresist, and a measuring system measures parameters of the photoresist based on radiation reflected from the photoresist. A processor is operatively coupled to the measuring system and a lamp driving system, the processor receives photoresist parameter data from the measuring system and the processor uses the data to at least partially base control of the at least one lamp so as to regulate temperature of at least a portion of the photoresist.

Another aspect of the present invention relates to a system for regulating photoresist temperature which includes a substantially wet photoresist covering a substrate for use in a lithographic process. A bakeplate supports the substrate, and the bakeplate includes front and back surfaces, the front surface engaging a backside of the substrate. A plurality of heaters are operatively coupled to the back surface of the bakeplate for regulating temperature of at least portions of the photoresist, respectively, via heat conduction through the bakeplate and substrate. A heater driver drives the plurality of heaters; and a temperature sensing system senses temperature of at least a portion of the photoresist, the temperature sensing system including a processor operatively coupled to the heater driver, the processor employing the heater driver in controlling the plurality of heaters.

Yet another aspect of the present invention relates to a method for regulating photoresist temperature, comprising the steps of: defining a photoresist as a plurality of portions; directing radiation onto at least one of the portions; collecting radiation reflected from the at least one portion; analyzing the reflected radiation to determine the temperature of the at least one portion; and controlling a heating device to regulate the temperature of the at least one portion.

Still another aspect of the present invention relates to a method for regulating temperature of a photoresist, comprising the steps of: partitioning the photoresist into a plurality of grid blocks; using a plurality of heaters to heat the photoresist, each heater functionally corresponding to a respective grid block; determining temperatures of portions of the photoresist, each portion corresponding to a respective grid block; and using a processor to coordinate control of the heaters, respectively, in accordance with determined temperatures of the respective portions of the photoresist.

Another aspect of the present invention relates to a system for regulating temperature of a photoresist, including: means for sensing temperatures of a plurality of portions of the photoresist; heating means for heating the respective photoresist portions; and processing means for selectively controlling the heating means so as to regulate temperature of the respective photoresist portions.

Still yet another aspect of the present invention relates to a system for regulating heating temperature of a material. The system includes at least one lamp operative to heat a portion of the material; and a lamp driving system for driving the at least one lamp. The system further includes at least one optical fiber for directing radiation to the portion of the material; a measuring system for measuring parameters of the material based on radiation reflected from the material; and a processor operatively coupled to the measuring system and a lamp driving system, the processor receiving material parameter data from the measuring system and the processor using the data to at least partially base control of the at least one lamp so as to regulate temperature of at least a portion of the material.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1a is schematic block diagram of a photoresist heating system in accordance with the present invention;

FIG. 1c is a partial schematic block diagram of the system of FIG. 1a being employed in connection with determining photoresist temperature by measuring photoresist color in accordance with the present invention;

FIG. 2 is a perspective illustration of a top side of a plate, and a substrate having a photoresist formed thereon in accordance with the present invention;

FIG. 3 is a representative three-dimensional grid map of a photoresist illustrating temperature amplitudes taken at grid blocks of the grid map in accordance with the present invention;

FIG. 4 is a temperature amplitude table correlating the temperature amplitudes of FIG. 3 with desired values for the temperature amplitudes in accordance with the present invention;

FIGS. 5a and 5b are perspective illustrations of top and bottom surfaces of a bakeplate in accordance with the present invention;

DETAILED DESCRIPTION OF THE INVENTION

Figure 1B:
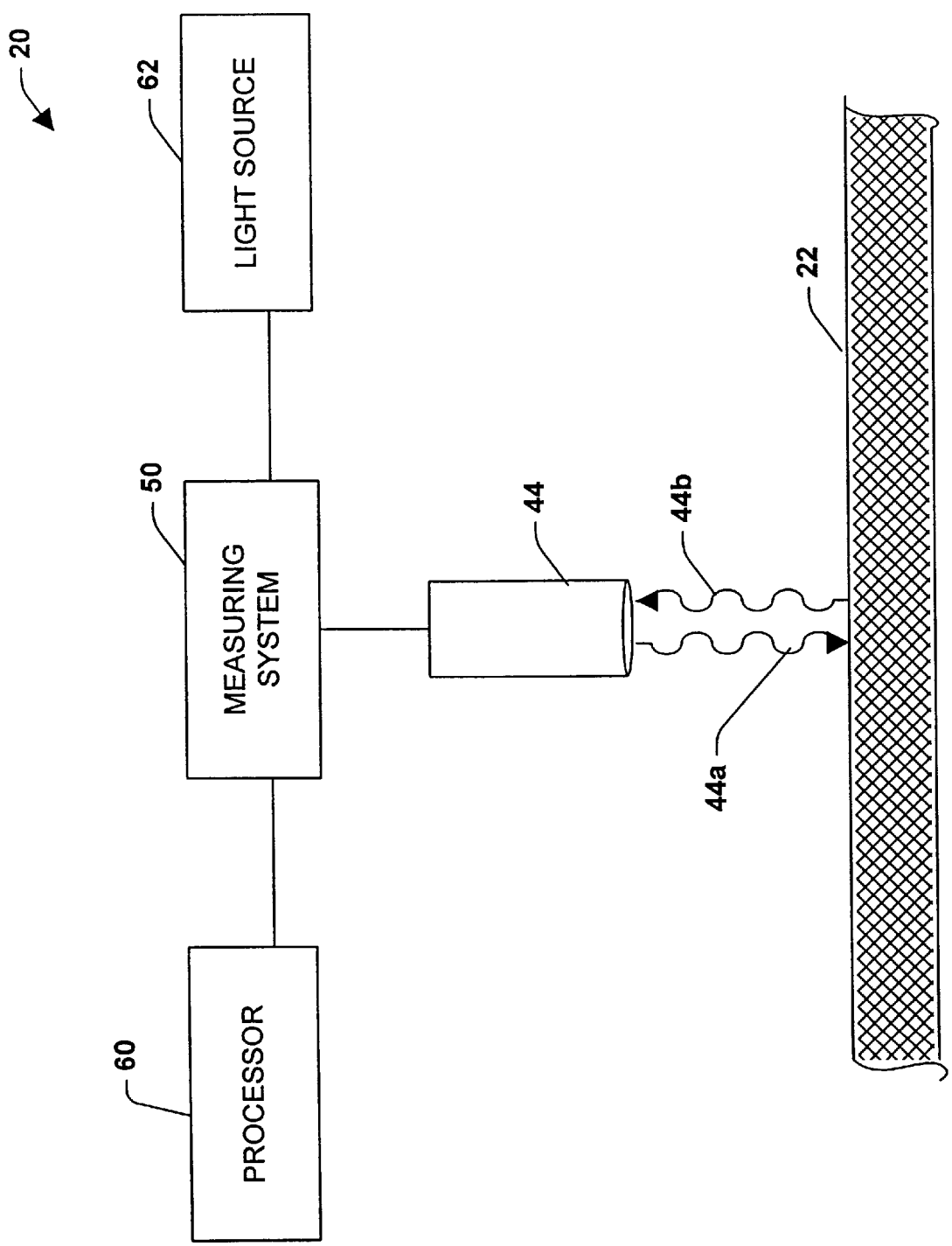
FIG. 1b is a partial schematic block diagram of the system of FIG. 1a being employed in connection with determining photoresist temperature by measuring photoresist thickness in accordance with the present invention.

The present invention will now be described with reference to the drawings, wherein like reference numerals are used to refer to like elements throughout. The present invention will be described with reference to a system for controlling photoresist heating temperature using a plurality of heaters. The following detailed description is of the best modes presently contemplated by the inventors for practicing the invention. It should be understood that the description of these preferred embodiments are merely illustrative and that they should not be taken in a limiting sense.

Referring initially to FIG. 1a, a system 20 for heating substantially uniformly a photoresist 22 is shown. It is to be appreciated that the present invention may be applied to pre-baking as well as post exposure baking of the photoresist. Furthermore, although the present invention is primarily described within the context of heating photoresist, it is to be understood that the present invention may be applied to heating of top and bottom anti-reflective coatings, low K dielectric materials, spin-on-glass (SOG) and other spin-on materials. After the photoresist 22 is dried, suitable photolithographic techniques may be performed to pattern the substrate 26 in a desired manner. The substrate 26 is supported over a baking plate 30 by a plurality of proximity pins 32 which prevent contact between the substrate 26 and plate 30. The proximity pins 32 elevate the substrate 26 about 1 mm above the surface of the plate 30. Preventing contact of the substrate 26 with the plate 30 mitigates contamination of the substrate 26 with particles from the plate 30. However, it is to be appreciated that the scope of the present invention is intended to cover systems where the substrate is in contact with the plate.

The system 20 further includes a plurality of heat lamps 40 which are selectively controlled by the system 20 so as to facilitate uniform heating of the photoresist 22. A plurality of optical fibers 44 project radiation onto respective portions of the photoresist 22. Radiation reflected from the photoresist 22 is processed by a photoresist parameter measuring system 50 to measure at least one parameter relating to the temperature of the photoresist 22. The reflected radiation is processed with respect to the incident radiation in measuring the various parameters.

The measuring system 50 includes an interferometry system 50a and a spectrometry system 50b. It is to be appreciated that any suitable interferometry system and/or spectrometry system may be employed to carry out the present invention and such systems are intended to fall within the scope of the hereto appended claims. Interferometry systems and spectrometry systems are well known in the art, and therefore further discussion related thereto is omitted for sake of brevity.

A source 62 of monochromatic radiation such as a laser provides radiation to the plurality of optical fibers 44 via the measuring system 50. Preferably, the radiation source 62 is a frequency stabilized laser however it will be appreciated that any laser or other radiation source (e.g., laser diode or helium neon (HeNe) gas laser) suitable for carrying out the present invention may be employed.

A processor 60 receives the measured data from the measuring system 50 and determines the temperature of respective portions of the photoresist 22. The processor 60 is operatively coupled to system 50 and is programmed to control and operate the various components within the photoresist heating system 20 in order to carry out the various functions described herein. The processor or CPU 60 may be any of a plurality of processors, such as the AMD K6 and other similar and compatible processors. The manner in which the processor 60 can be programmed to carry out the functions relating to the present invention will be readily apparent to those having ordinary skill in the art based on the description provided herein.

A memory 70 which is operatively coupled to the processor 60 is also included in the system 20 and serves to store program code executed by the processor 60 for carrying out operating functions of the system 20 as described herein. The memory 70 includes read only memory (ROM) and random access memory (RAM). The ROM contains among other code the Basic Input-Output System (BIOS) which controls the basic hardware operations of the system 20. The RAM is the main memory into which the operating system and application programs are loaded. The memory 70 also serves as a storage medium for temporarily storing information such as photoresist temperature, temperature tables, photoresist coordinate tables, interferometry information, spectrometry information and other data which may be employed in carrying out the present invention. For mass data storage, the memory 70 may include a hard disk drive (e.g., 10 Gigabyte hard drive).

Power supply 78 provides operating power to the system 20. Any suitable power supply (e.g., battery, line power) may be employed to carry out the present invention.

The processor 60 is also coupled to a lamp driving system 80 which drives the heat lamps 40. The lamp driving system 80 is controlled by the processor 60 so as to selectively vary heat output of the respective heat lamps 40. Each respective portion of the photoresist 22 has a corresponding lamp 40 and optical fiber 44 associated therewith. The processor 60 is able to monitor the temperature of the various photoresist portions and selectively regulate the temperatures of each portion via the corresponding heat lamps 40. As a result, the system 20 provides for regulating heating temperature of the photoresist 22 with substantial uniformity, which in turn improves fidelity of image transfer in a lithographic process employing the photoresist 22.

FIG. 1b illustrates the system 20 being employed to measure thickness of the photoresist 22 at a particular portion. The temperature of the photoresist 22 will have an impact on the thickness thereof. The optical fiber 44 directs radiation 44a incident to the surface of the photoresist 22, and the phase and/or intensity of reflected radiation 44b from the surface of photoresist will vary in accordance with the thickness of the photoresist 22. The measuring system 50 collects the reflected radiation 44b and processes the reflected radiation 44b in accordance with interferometry and/or spectrometry techniques to provide the processor 60 with data corresponding to the thickness of the photoresist 22. The processor 60 analyzes the data and determines the temperature of the photoresist 22.

FIG. 1c illustrates the system being used to measure fluorescence of the photoresist 22. A substantially inert fluorescence material (e.g., europium chelate) is combined with the photoresist 22 such that the color of the photoresist 22 will vary in accordance with the temperature thereof. The inert fluorescence material is selected so as to not impede the performance of the photoresist 22. It is to be appreciated that any suitable material which provides for temperature related color change of the photoresist 22 without affecting the performance of the photoresist 22 may be employed and is intended to fall within the scope of the hereto appended claims. The optical fiber 44 directs the radiation 44a incident to the surface of the photoresist and the phase of reflected radiation 44c will vary in accordance with the color of the photoresist 22. The measuring system 50 collects the reflected radiation 44b and processes the reflected radiation 44b in accordance with spectrometry techniques to provide the processor 60 with data corresponding to the color of the photoresist 22. The processor 60 analyzes the data and determines the temperature of the photoresist 22.

Figure 1D:
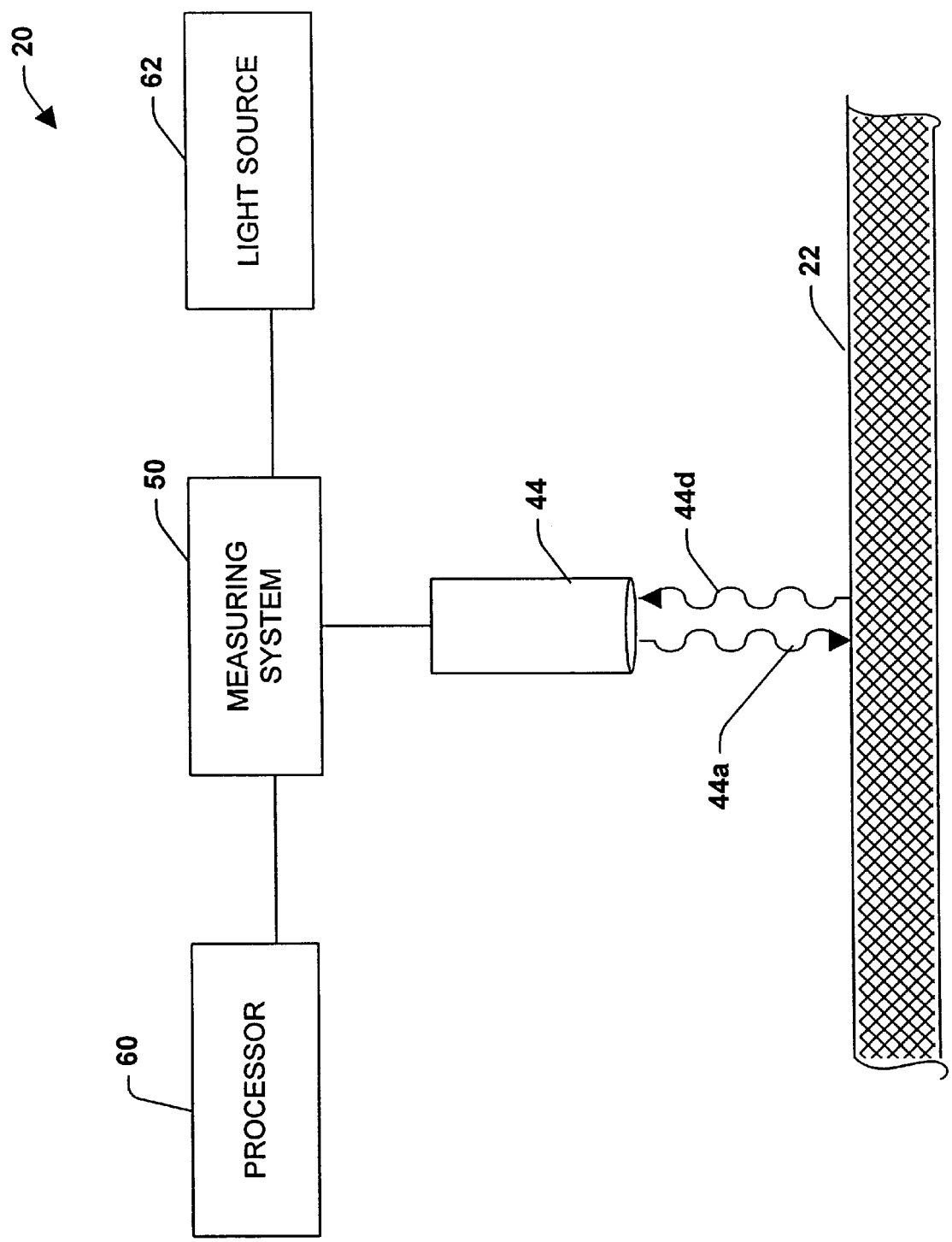
FIG. 1d is a partial schematic block diagram of the system of FIG. 1a a being employed in connection with determining photoresist temperature by measuring photoresist absorptivity in accordance with the present invention.

Yet another parameter that may be measured by the system 20 is absorptivity of the photoresist 22 as shown in FIG. 1d. The absorption of the incident radiation 44a by the photoresist 22 corresponds to the temperature of the photoresist 22. Accordingly, the phase and/or intensity of reflected radiation 44d will be indicative of the absorptivity of the photoresist 22 which in turn is indicative of photoresist temperature. The measuring system 50 collects the reflected radiation 44d and processes the reflected radiation 44d in accordance with interferometry and/or spectrometry techniques to provide the processor 60 with data corresponding to the absorptivity of the photoresist 22. The processor 60 analyzes the data and determines the temperature of the photoresist 22.

It is to be appreciated that although FIGS. 1a–8 are described herein with respect to heating the photoresist 22, these same figures may be used to represent heating of any other suitable material (e.g., top and bottom anti-reflective coatings, low K dielectric materials, spin-on-glass (SOG) and other spin-on materials) and those figures may be schematically referenced by numeral 22 of these figures.

Turning now to FIGS. 2–4 the plate 30 is shown in perspective supporting the substrate 26 having photoresist 22 thereon. The photoresist heating system 20 provides for regulating the temperature of the photoresist 22 during the above described heating process in order to facilitate uniform heating of the photoresist 20. The photoresist 22 may be divided into a grid pattern as that shown in FIG. 3. Each grid block (XY) of the grid pattern corresponds to a particular portion of the photoresist 22, and each portion is individually monitored for temperature as well as controlled for temperature.

In FIG. 3, each respective portion of the photoresist $(X_1Y_1 \ldots X_{12}, Y_{12})$ is being monitored for temperature using a respective optical fiber 44, the measuring system 50 and the processor 60. The temperature amplitudes of each photoresist portion is shown. As can be seen, the temperature of the photoresist at coordinate $X_7Y_6$ is substantially higher than the temperature of the other photoresist portions XY. It is to be appreciated that although FIG. 3 illustrates the photoresist 22 being mapped (partitioned) into 144 grid block portions, the photoresist 22 may be mapped with any suitable number of portions. Although the present invention is described with respect to one optical fiber 44 corresponding to one lamp 40 which correspond to one grid block XY, it is to be appreciated that any suitable number of optical fibers 44 may correspond to any suitable number of lamps 40 and vice versa, and the like for grid blocks XY.

FIG. 4 is a representative table of temperature amplitudes (taken at the various grid blocks which have been correlated with acceptable temperature amplitude values for the portions of the photoresist 22 mapped by the respective grid blocks. As can be seen, all of the grid blocks except grid block $X_7Y_6$ have temperature amplitudes corresponding to an acceptable temperature value ($T_A$) (e.g., are within an expected range of temperature amplitudes), while grid block $X_7Y_6$ has an undesired temperature value ($T_U$). Thus, the processor 60 has determined that an undesirable temperature condition exists at the portion of the photoresist 22 mapped by grid block $X_7Y_6$. Accordingly, the processor 60 can drive the lamp $40_{7,6}$ which corresponds to the portion of the photoresist 22 mapped at grid block $X_7Y_6$ so as to bring the temperature of this portion of the photoresist 22 down to an acceptable level. It is to be appreciated that the lamps 40 may be driven so as to increase and/or decrease the temperature of the respective photoresist portions as desired.

FIGS. 5a, 5b and 6–8 illustrate another embodiment of the present invention. Turning to FIGS. 5a–5b in particular, the substrate 22 having substantially wet photoresist 24 thereon is supported by a bakeplate 100. The top side of the bakeplate 100 supports the substrate 24 as shown in FIG. 5a, and the bottom side of the bakeplate 100 includes a plurality of heating elements 110 (FIG. 5b). The heating elements 110 are distributed across the bottom surface of the bakeplate 100 so as to provide heat to respective portions of the substrate 22 residing on the bakeplate 100. Any suitable heating elements (e.g., electric coils, ceramic heaters, heating plates, thermoelectric heaters, gas heaters) may be employed to carry out the present invention and are intended to fall within the scope of the hereto appended claims. The bakeplate 100 is substantially thin (e.g., 1–10 mm) and is thermally conductive so as to transfer heat by conduction to and from the substrate 22, which in turn effects heating of the photoresist 24.

Figure 6:
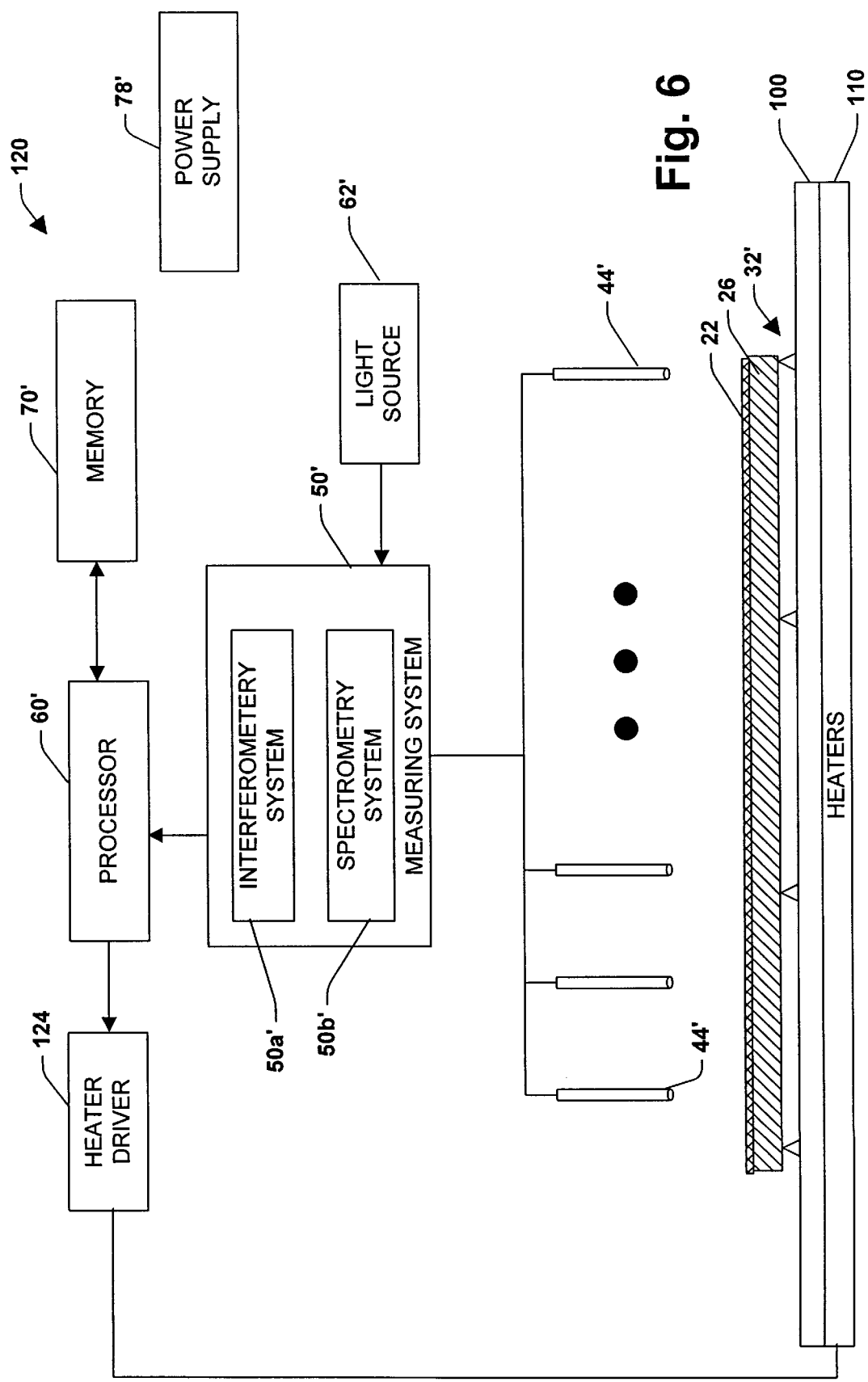
FIG. 6 is detailed schematic diagram illustrating another system for controlling photoresist heating temperature in accordance with the present invention.

FIG. 6 is a schematic block diagram of a heating system 120 employing the bakeplate 100 and heating elements 110 of FIG. 5b. The system 120 is similar to the system 20 (FIG. 1), and like components between the systems include like reference numerals except that the reference numbers for like components of system 120 will be followed by a prime ('). Further details regarding the like components is omitted to avoid redundancy.

The system 120 includes the photoresist 22 residing over the substrate 26 which is supported by the bakeplate 100. After the photoresist 22 is dried, suitable photolithographic techniques may be performed to pattern the substrate 26 in a desired manner. The system 120 further includes the plurality of heaters 110 which are distributed over the bottom surface of the bakeplate 100 (FIG. 5b). The system 120 selectively controls the heaters 110 so as to facilitate uniform heating of the photoresist 22. A plurality of optical fibers 44' project radiation onto respective portions of the photoresist 22. Radiation reflected from the photoresist 22 is processed by a measuring system 50' to measure at least one parameter relating to the temperature of the photoresist 22. As noted above with respect to system 20, the parameters include thickness of the photoresist, color of the photoresist, and absorptivity of the photoresist. Each of these parameters have a correlation with the temperature of the photoresist, and variances of each of these parameters manifests in variances of radiation reflected from the surface of the photoresist 22.

The processor 60' receives the measured data from the measuring system 50' and determines the temperature of respective portions of the photoresist 22. The processor 60' is operatively coupled to the measuring system 50' and is programmed to control and operate the various components within the photoresist heating system 120 in order to carry out the functions described herein.

A memory 70' is operatively coupled to the processor 60' and is also included in the system 120 to store program code executed by the processor 60' for carrying out operating functions of the system 120 as described herein. The memory 70' may serve as a storage medium for temporarily storing information such as photoresist temperature, temperature tables, photoresist coordinate tables, interferometry information, spectrometry information and other data which may be employed in carrying out the present invention. For mass data storage, the memory 70' may include a hard disk drive (e.g., 10 Gigabyte hard drive). A power supply 78' provides operating power to the system 120.

The processor 60' is also coupled to a heater driver system 124 which drives the heaters 110. The heater driver system 124 is controlled by the processor 60' so as to selectively vary heat output of the respective heaters 110. Each respective portion of the photoresist 22 has a corresponding heater 110 and optical fiber 44' associated therewith. The processor 60' is able to monitor the temperature of the various photoresist portions and selectively regulate the temperatures of each portion via the corresponding heaters 110. As a result, the system 120 provides for regulating heating temperature of the photoresist 22 with substantial uniformity, which in turn improves fidelity of image transfer in a lithographic process employing the photoresist 22.

Figure 7:
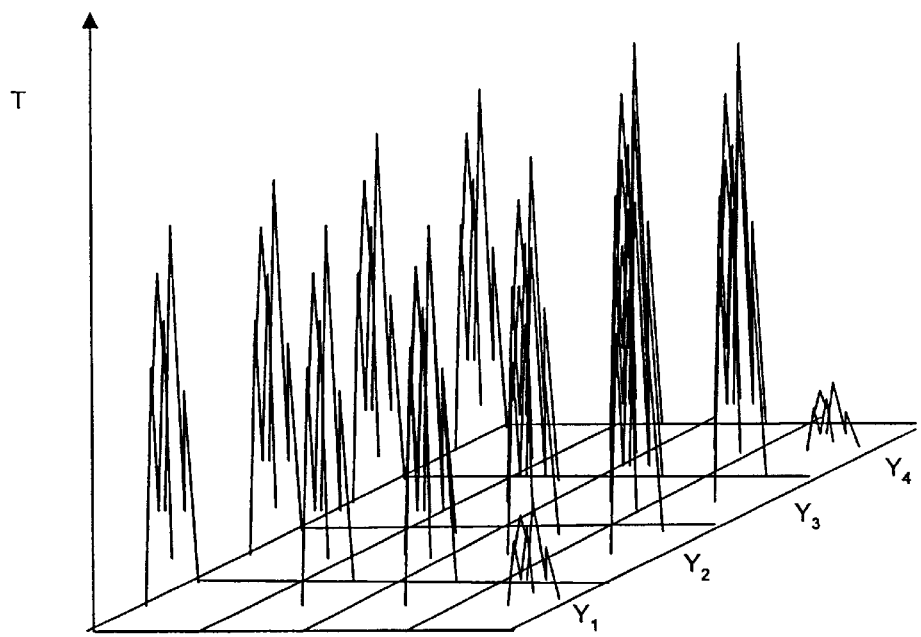
FIG. 7 is a representative three-dimensional grid map of the bakeplate of FIG. 5 illustrating temperature amplitudes taken at grid blocks of the grid map in accordance with the present invention.
Figure 8:
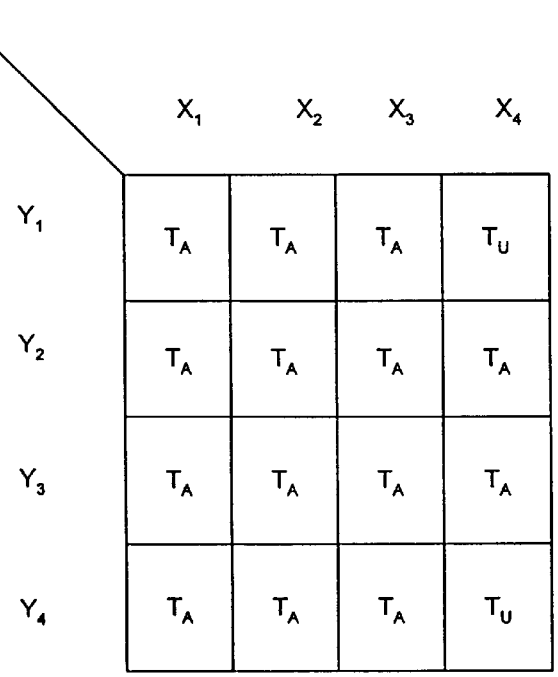
FIG. 8 is a temperature amplitude table correlating the temperature amplitudes of FIG. 7 with desired values for the temperature amplitudes in accordance with the present invention.

Turning now to FIGS. 7–8 the photoresist heating system 120 provides for regulating the temperature of the photoresist 22 during the above described heating process in order to facilitate uniform heating of the photoresist 20. The photoresist 22 may be divided into a grid pattern as that shown in FIG. 7. Each grid block (XY) of the grid pattern corresponds to a particular portion of the photoresist 22, and each portion is individually monitored for temperature as well as controlled for temperature.

The temperature amplitudes of each photoresist portion is shown in FIG. 7. As can be seen, the temperature of the photoresist at coordinates $X_4Y_1$ and $X_4Y_4$ are substantially lower than the temperature of the other photoresist portions XY. It is to be appreciated that although the photoresist 22 is illustrated being mapped (partitioned) into 16 grid block portions, the photoresist 22 may be mapped with any suitable number of portions. Likewise, any suitable number of heaters 110 may be employed in carrying out this invention. As can be seen from FIG. 5b, there are 16 heaters 110, each heater 110 corresponding to a respective grid block XY.

FIG. 8 is a representative table of temperature amplitudes (taken at the various grid blocks) which have been correlated with acceptable temperature amplitude values for the portions of the photoresist 22 mapped by the respective grid blocks. As can be seen, all of the grid blocks except grid blocks $X_4Y_1$ and $X_4Y_4$ have temperature amplitudes corresponding to an acceptable temperature value ($T_A$) (e.g., are within an expected range of temperature amplitudes), while grid blocks $X_4Y_1$ and $X_4Y_4$ have undesired temperature values ($T_U$). Thus, the processor 60' has determined that an undesirable temperature condition exists at portions of the photoresist 22 mapped by grid blocks $X_4Y_1$ and $X_4Y_4$. Accordingly, the processor 60' can drive the heaters $110_{4,1}$ and $110_{4,4}$ which correspond to the portions of the photoresist 22 mapped at grid blocks $X_4Y_1$ and $X_4Y_4$ so as to bring the temperature of those portions of the photoresist 22 up to an acceptable level.

Figure 9:
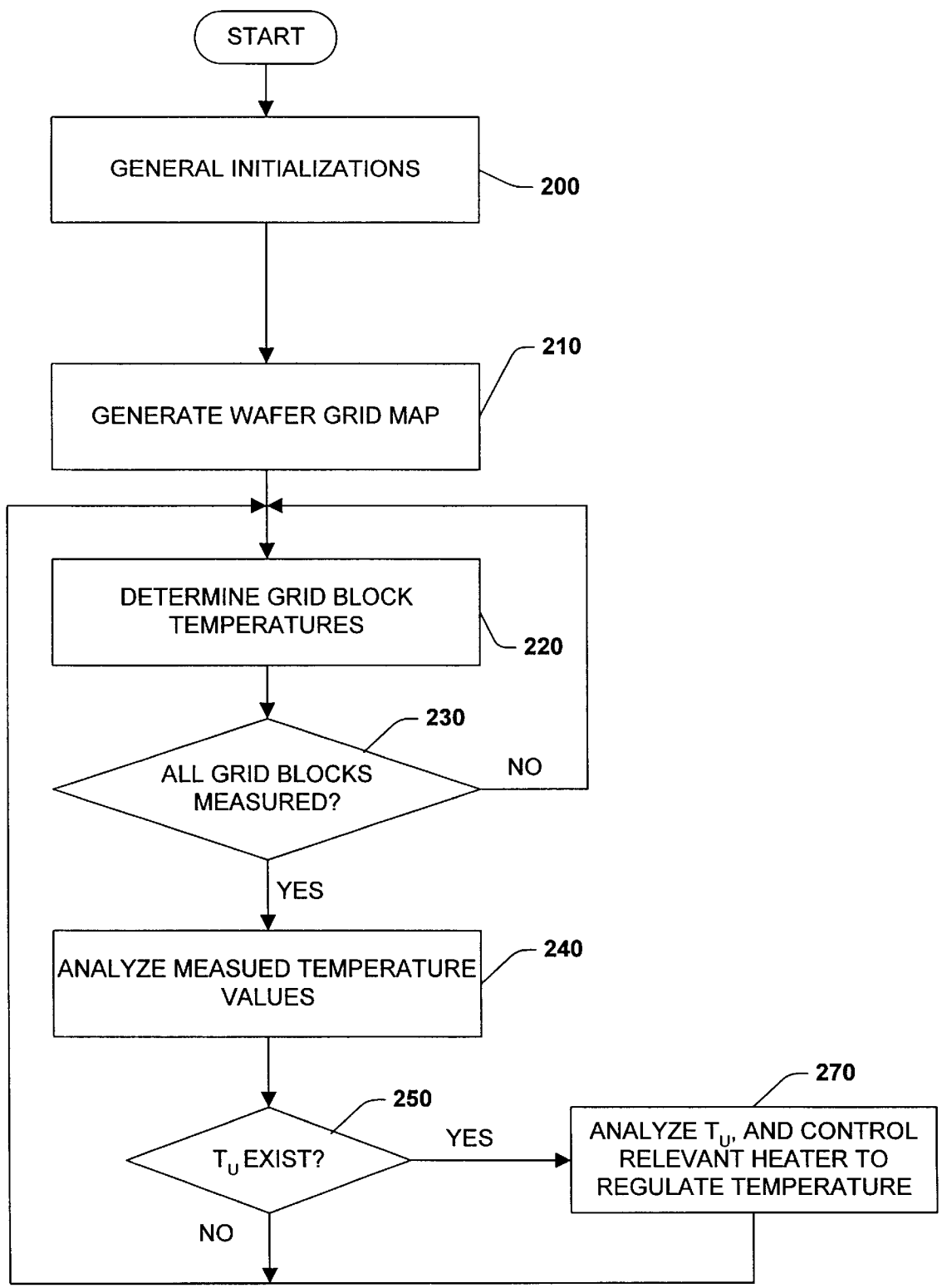
FIG. 9 is a flow diagram illustrating one specific methodology for carrying out the present invention.

FIG. 9 is a flow diagram illustrating one particular methodology for carrying out the present invention. In step 200, the processor 60 performs general initializations to the photoresist heating system 20. In step 210, the processor 60 maps at least a portion of the photoresist 22 into a plurality of grid blocks "XY". In step 220, temperature determinations are made with respect to the various photoresist portions mapped by the respective grid blocks XY. In step 230, the processor 60 determines if all grid block measurements have been taken. If no, the processor 60 returns to step 220. If yes, the processor 60 analyzes the determined temperature values against a table of acceptable temperature levels for the respective portions of the photoresist 22. In step 250, the processor 60 determines if any grid block temperature values are not acceptable. If all values grid block temperature values are acceptable, the processor 60 ends this particular iteration of the present methodology and returns to step 220 to perform another iteration. If unacceptable temperature values are found for any of the grid blocks, the processor 60 advances to step 270 where the unacceptable temperature values are analyzed. After the analyses, the processor 60 controls relevant lamps 40 (or heaters 110) (which correspond to the grid blocks with unacceptable temperature values) to regulate the temperature of the respective photoresist portions to an acceptable level. The present iteration is then ended and the process returns to step 220 to perform another iteration..

The present invention provides for a system and method for heating a photoresist in a substantially uniform manner. As a result, the present invention facilitates improving photoresist integrity and reliability which in turn afford for increases in quality of image transfer in lithographic processes employing a photoresist heated in accordance with the present invention.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for regulating photoresist heating temperature, comprising:
   at least one lamp operative to heat a portion of a photoresist;
   a lamp driving system for driving the at least one lamp;
   at least one optical fiber for directing radiation to the portion of the photoresist;
   a measuring system for measuring parameters of the photoresist based on radiation reflected from the photoresist; and
   a processor operatively coupled to the measuring system and a lamp driving system, the processor receiving photoresist parameter data from the measuring system and the processor using the data to at least partially base control of the at least one lamp so as to regulate temperature of at least a portion of the photoresist.

2. The system of claim 1, the measuring system further including an interferometry system for processing the radiation reflected from the photoresist.

3. The system of claim 1, the measuring system further including a spectrometry system for processing the radiation reflected from the photoresist.

4. The system of claim 2, the processor being operatively coupled to the interferometry system, the processor analyzing data relating to photoresist temperature received from the interferometry system, and the processor basing control of the at least one lamp at least partially on the analyzed data.

5. The system of claim 3, the processor being operatively coupled to the spectrometry system, the processor analyzing data relating to photoresist temperature received from the spectrometry system, and the processor basing control of the at least one lamp at least partially on the analyzed data.

6. The system of claim 4, the data further relating to thickness of the photoresist.

7. The system of claim 5, the data further relating to color of the photoresist.

8. The system of claim 5, the data further relating to absorptivity of the photoresist.

9. The system of claim 1, the processor mapping the photoresist into a plurality of grid blocks, and making a determination of photoresist temperature at a grid block.

10. The system of claim 1, wherein the processor determines the existence of an unacceptable temperature for at least a portion of the photoresist based upon the determined temperature differing from an acceptable value.

11. The system of claim 10, wherein the processor controls the at least one lamp to regulate the temperature of the photoresist portion to an acceptable value.

12. The system of claim 1, the photoresist including a substantially inert material which causes the color of the photoresist to vary with changes in photoresist temperature.

13. The system of claim 12, the substantially inert material including europium chelate.

14. A system for regulating photoresist temperature, comprising:
   a substantially wet photoresist covering a substrate for use in a lithographic process;
   a bakeplate for supporting the substrate, the bakeplate including:
     front and back surfaces, the front surface engaging a backside of the substrate;
     a plurality of heaters operatively coupled to the back surface of the bakeplate for regulating temperature of at least portions of the photoresist, respectively, via heat conduction through the bakeplate and substrate;
   a heater driver for driving the plurality of heaters; and
   a temperature sensing system for sensing temperature of at least a portion of the photoresist, the temperature sensing system including a processor operatively coupled to the heater driver, the processor employing the heater driver in controlling the plurality of heaters.

15. The system of claim 14, further including a memory storing at least a table of acceptable temperature ranges for the photoresist.

16. The system of claim 15, wherein the processor maps the photoresist into a plurality of grid blocks, and the temperature sensing system makes a temperature measurement at at least one grid block.

17. The system of claim 14, wherein the processor determines the existence of an unacceptable temperature for at least a portion of the photoresist based upon the measured temperature differing from an acceptable value.

18. The system of claim 17, wherein the processor controls at least one heater to regulate the temperature of the photoresist portion.

19. The system of claim 14 further including at least one optical fiber for directing radiation to the portion of the photoresist.

20. The system of claim 14, further including an interferometry system for processing radiation reflected from the photoresist.

21. The system of claim 14, further including a spectrometry system for processing radiation reflected from the photoresist.

22. The system of claim 20, the processor being operatively coupled to the interferometry system, the processor analyzing data relating to photoresist temperature received from the interferometry system, and the processor basing control of the at least one lamp at least partially on the analyzed data.

23. The system of claim 21, the processor being operatively coupled to the spectrometry system, the processor analyzing data relating to photoresist temperature received from the spectrometry system, and the processor basing control of the at least one lamp at least partially on the analyzed data.

24. The system of claim 22, the data further relating to thickness of the photoresist.

25. The system of claim 23, the data further relating to color of the photoresist.

26. The system of claim 23, the data further relating to absorptivity of the photoresist.

27. The system of claim 14, the photoresist including a substantially inert material which causes the color of the photoresist to vary with changes in photoresist temperature.

28. The system of claim 27, the substantially inert material including europium chelate.

29. A method for regulating photoresist temperature, comprising the steps of:

defining a photoresist as a plurality of portions;

directing radiation onto at least one of the portions;

collecting radiation reflected from the at least one portion;

analyzing the reflected radiation to determine the temperature of the at least one portion; and controlling a heating device to regulate the temperature of the at least one portion.

30. The method of claim 29, further including the step of using an interferometry system to process the reflected radiation.

31. The method of claim 29, further including the step of using a spectrometry system to process the reflected radiation.

32. The method of claim 30, further including the step of using a processor to control the at least one heating device based at least partially on data received from the interferometry system.

33. The method of claim 31, further including the step of using a processor to control the at least one heating device based at least partially on data received from the spectrometry system.

34. A method for regulating temperature of a photoresist, comprising the steps of:

partitioning the photoresist into a plurality of grid blocks;

using a plurality of heaters to heat the photoresist, each heater functionally corresponding to a respective grid block;

determining temperatures of portions of the photoresist, each portion corresponding to a respective grid block; and using a processor to coordinate control of the heaters, respectively, in accordance with determined temperatures of the respective portions of the photoresist.

35. A system for regulating temperature of a photoresist, comprising:

means for sensing temperatures of a plurality of portions of the photoresist;

heating means for heating the respective photoresist portions; and processing means for selectively controlling the heating means so as to regulate temperature of the respective photoresist portions.

36. A system for regulating heating temperature of a material, comprising:

at least one lamp operative to heat a portion of the material;

a lamp driving system for driving the at least one lamp;

at least one optical fiber for directing radiation to the portion of the material;

a measuring system for measuring parameters of the material based on radiation reflected from the material; and a processor operatively coupled to the measuring system and a lamp driving system, the processor receiving material parameter data from the measuring system and the processor using the data to at least partially base control of the at least one lamp so as to regulate temperature of at least a portion of the material.

37. The system of claim 36, the material being a top anti-reflective coating.

38. The system of claim 36, the material being a bottom anti-reflective coating.

39. The system of claim 36, the material being a low K dielectric material.

40. The system of claim 36, the material being spin on glass.

41. The system of claim 36, the material being a spin-on material.

* * * * *